(12) United States Patent
Dobashi et al.

(10) Patent No.: US 12,225,664 B2
(45) Date of Patent: Feb. 11, 2025

(54) CIRCUIT BOARD ASSEMBLY

(71) Applicant: Tyco Electronics Japan G.K., Kawasaki (JP)

(72) Inventors: Daisuke Dobashi, Kawasaki (JP); Takeshi Kimura, Kawasaki (JP)

(73) Assignee: TYCO ELECTRONICS JAPAN G.K., Kawasaki (JP)

( * ) Notice: Subject to any disclaimer, the term of this patent is extended or adjusted under 35 U.S.C. 154(b) by 304 days.

(21) Appl. No.: 17/747,349

(22) Filed: May 18, 2022

(65) Prior Publication Data

US 2022/0377891 A1    Nov. 24, 2022

(30) Foreign Application Priority Data

May 19, 2021 (JP) .................................. 2021-084915

(51) Int. Cl.
*H05K 1/14* (2006.01)
*H05K 1/02* (2006.01)

(52) U.S. Cl.
CPC ............. *H05K 1/14* (2013.01); *H05K 1/0243* (2013.01); *H05K 2201/044* (2013.01); *H05K 2201/10098* (2013.01)

(58) Field of Classification Search
CPC .. H05K 1/14; H05K 1/0243; H05K 2201/044; H05K 2201/10098
USPC .......................................................... 361/784
See application file for complete search history.

(56) References Cited

U.S. PATENT DOCUMENTS

| | | | |
|---|---|---|---|
| 6,075,708 A | 6/2000 | Nakamura | |
| 6,520,789 B2 * | 2/2003 | Daugherty, Jr. | H01R 12/52 439/493 |
| 11,191,161 B2 | 11/2021 | Koide et al. | |
| 2006/0067066 A1 * | 3/2006 | Meier | G06F 1/189 439/493 |
| 2011/0122045 A1 * | 5/2011 | Seo | H01Q 1/22 343/906 |
| 2016/0192515 A1 * | 6/2016 | Chen | H05K 1/14 361/740 |
| 2020/0359498 A1 | 11/2020 | Koide et al. | |
| 2021/0159623 A1 | 5/2021 | Sakurai et al. | |
| 2022/0225525 A1 * | 7/2022 | Ezaki | H05K 7/1468 |

FOREIGN PATENT DOCUMENTS

| | | |
|---|---|---|
| DE | 102007046493 A1 | 4/2009 |
| EP | 1091626 A1 | 4/2001 |
| EP | 3697182 A1 | 8/2020 |
| JP | 2004311813 A | 11/2004 |
| JP | 2019134081 A | 8/2019 |
| JP | 2020025012 A | 2/2020 |

OTHER PUBLICATIONS

Extended Search Report from the European Patent Office dated Sep. 28, 2022, corresponding to Application No. 22174198.6-1202, 8 pages.

* cited by examiner

*Primary Examiner* — Binh B Tran

(57) ABSTRACT

A circuit board assembly includes a first circuit board, a second circuit board having a first side extending adjacent to a first side of the first circuit board, and a metal fitting including a portion bent at the angle and spanning both the first side of the first circuit board and the first side of the second circuit board. The second circuit board is in a posture having an angle other than 180° to the first circuit board. The metal fitting is fixed to both the first circuit board and the second circuit board.

15 Claims, 15 Drawing Sheets

CIRCUIT BOARD ASSEMBLY

CROSS-REFERENCE TO RELATED APPLICATIONS

This application claims the benefit of the filing date under 35 U.S.C. § 119(a)-(d) of Japanese Patent Application No. 2021-084915, filed on May 19, 2021.

FIELD OF THE INVENTION

The present invention relates to a circuit board assembly in which a plurality of circuit boards are connected to one another.

BACKGROUND

A structure including a plurality of circuit boards having a bent shape and connected to one another has been known. For example, Japanese Patent Application 2004-311813A discloses two circuit boards connected to each other by a jumper wire. In JP2004-311813A, the length of the jumper wire has a margin to reduce a load applied to respective connections between the jumper wire and the two circuit boards due to bending between the circuit boards.

Each of Japanese Patent Application 2019-134081A and Japanese Patent Application 2020-025012A discloses two circuit boards having a shape bent at an angle of 90° as a whole by forming a protrusion on an end surface of one of the two circuit boards, forming an insertion hole into which the protrusion is to be inserted on the other circuit board, and inserting the protrusion into the insertion hole.

There is a case where a circuit board assembly in which a bending angle between circuit boards and a relative positional relationship between the circuit boards have been strictly adjusted is required; for example, a case where a circuit board assembly including a plurality of circuit boards connected to one another is further assembled into a third circuit board.

In the circuit board assembly including the circuit boards connected to each other by the jumper wire, as disclosed in the JP2004-311813A, if there is no support other than the jumper wire, an angle between the circuit boards and a positional relationship between the circuit boards are incorrect. The circuit board assembly is unsuitable for a circuit board assembly requiring a strict angle and positional relationship.

In the circuit board assembly having a structure in which one of the circuit boards and the other circuit board are respectively provided with the protrusion and the insertion hole and the protrusion is inserted into the insertion hole, as disclosed in each of JP2019-134081A and JP2020-025012A, the circuit boards are combined with each other and are fixed to each other by soldering, for example, and then an angle between the circuit boards and a positional relationship between the circuit boards do not easily change. However, to implement the circuit board assembly having this structure, the circuit boards need to be cut out from a circuit board of a large size, and then the circuit boards need to be combined with each other. Accordingly, in a combination stage, the circuit boards need to be fixed to each other after the angle between the circuit boards and the positional relationship between the circuit boards are strictly adjusted. The adjustment takes time and cost.

SUMMARY

A circuit board assembly includes a first circuit board, a second circuit board having a first side extending adjacent to a first side of the first circuit board, and a metal fitting including a portion bent at the angle and spanning both the first side of the first circuit board and the first side of the second circuit board. The second circuit board is in a posture having an angle other than 180° to the first circuit board. The metal fitting is fixed to both the first circuit board and the second circuit board.

BRIEF DESCRIPTION OF THE DRAWINGS

The invention will now be described by way of example with reference to the accompanying Figures, of which.

DETAILED DESCRIPTION OF THE EMBODIMENT(S)

Figure 1A:
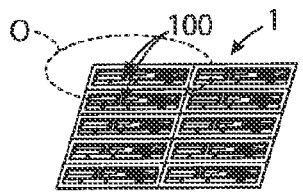
FIGS. 1A-1E illustrate a manufacturing method applicable to manufacture of a circuit board assembly according to the invention.

Embodiments of the invention will be described below. Various elements in the drawings are merely schematically and illustratively shown for understanding of the present disclosure and may differ in outward appearance and/or dimensional ratio from actual ones. Furthermore, the following description uses, on an as-needed basis, terms that indicate particular directions or positions. However, the use of these terms is intended to facilitate understanding of the invention with reference to the drawings, and the meanings of these terms are not intended to limit the technical scope of the present disclosure. Further, components given identical reference signs throughout a plurality of drawings refer to identical or equivalent components.

First, an example of a manufacturing method that can be adopted as a method for manufacturing a circuit board assembly according to the invention will be described.

Figure 1B:
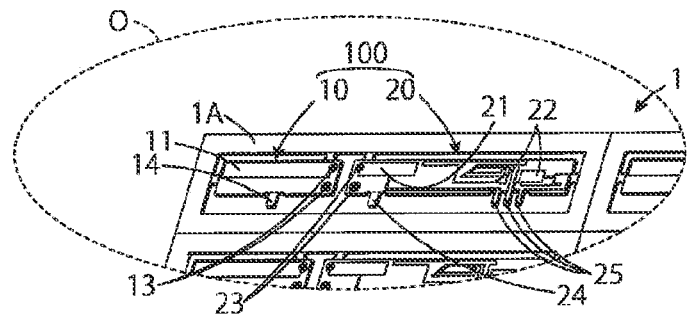

FIGS. 1A-1D illustrate an example of a manufacturing method applicable to manufacture of the circuit board assembly according to the invention. FIG. 1A shows a circuit board 1 of a large size. FIG. 1B is an enlarged view of a portion of an ellipse O indicated by a dotted line in FIG. 1A.

Eight circuit board assemblies 100 are manufactured from the circuit board 1 of a large size. In the description herein, a portion to be a circuit board assembly 100 after manufacture is assigned the same reference numeral as that after the manufacture and is referred to as a circuit board assembly 100 even in a stage before being completed as the circuit board assembly 100. The same applies to a portion to be a first circuit board 10 or a second circuit board 20 after the manufacture.

In FIGS. 1A and 1B, a circuit pattern has already been printed, and punching has been further performed, to form respective prototypes of the first circuit board 10 and the second circuit board 20. The first circuit board 10 and the second circuit board 20 respectively include a first circuit portion 11 and a second circuit portion 21 that are electrically connected to each other and function as an antenna. A third circuit portion 22 is further formed in the second circuit board 20.

The first circuit board 10 and the second circuit board 20 in a stage illustrated in FIG. 1A and FIG. 1B enter a state partially connected to a frame 1A obtained by punching the first circuit board 10 and the second circuit board 20 from the circuit board 1 of a large size such that a position on the circuit board 1 of a large size is maintained. Through holes 13 and 23 into which a metal fitting 50 is to be inserted are respectively formed in both the circuit board 10 and the second circuit board 20. The through holes 13 and 23 each correspond to an example of a receiving portion referred to herein. The receiving portion is not necessarily a through hole.

Figure 1C:
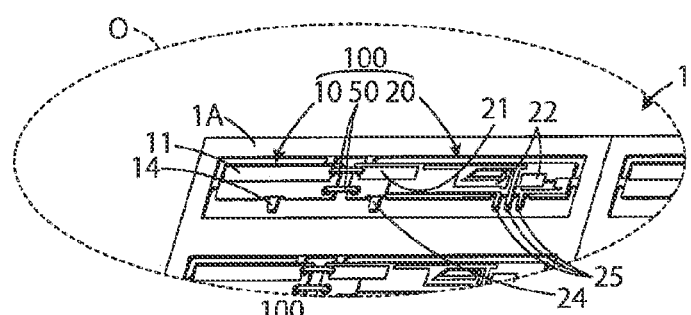

FIG. 1C is a diagram illustrating a state where the metal fitting 50 is inserted into the respective through holes 13 and 23 in the first circuit board 10 and the second circuit board 20 illustrated in FIGS. 1A and 1B.

The metal fitting 50 is manufactured separately from the first circuit board 10 and the second circuit board 20 illustrated in FIGS. 1B-1E. Specifically, an example of the metal fitting 50 is a metal flat plate punched in a strip shape and bent to respectively insert both its end portions into the through holes 13 and 23 or a metal fitting including the metal flat plate. For the metal fitting 50, for example, an element other than the metal flat plate, such as a coating film such as an insulating coating film or a non-metallic structure for entirely increasing a strength may be further partially combined with the bent metal flat plate. The metal fitting 50 has its rigidity and electrical conductivity considered to take charge of mechanical coupling between the first circuit board 10 and the second circuit board 20 and also take charge of electrical connection therebetween. This implements a circuit board assembly 100 having a simpler structure than that of a combination of a metal fitting for mechanical fixing and an electrical wiring separate from the metal fitting. In an example illustrated in FIG. 1C, the metal fitting 50 has its both end portions respectively inserted into the through holes 13 and 23, and is soldered thereto to pour solder into respective gaps between the through holes 13 and 23 and the end portions.

In this stage shown in FIG. 1C, a relative position between the first circuit board 10 and the second circuit board 20 is fixed. In this stage, both the first circuit board 10 and the second circuit board 20 remain connected to the frame 1A of the circuit board 1 of a large size, and the first circuit board 10 and the second circuit board 20 are fixed to each other with a high-accuracy relative positional relationship without performing special adjustment.

Figure 1D:
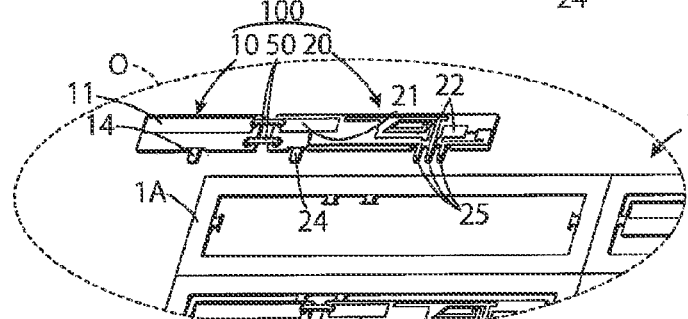
Figure 1E:
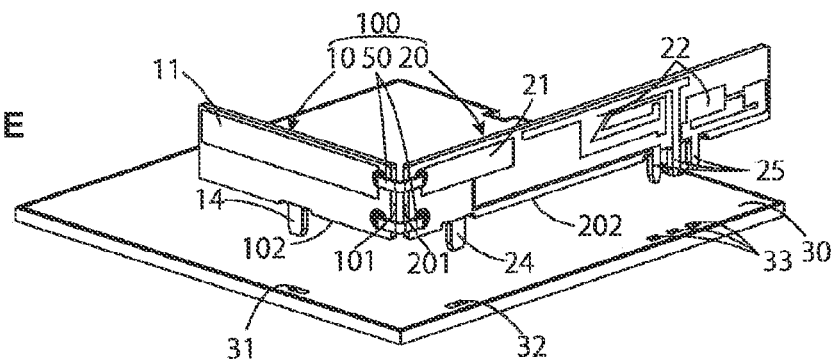

FIG. 1D is a diagram illustrating a state where the circuit board assembly 100 is separated from the frame 1A of the circuit board 1 of a large size. In the circuit board assembly 100 illustrated in FIG. 1D, the first circuit board 10 and the second circuit board 20 are coplanar. The circuit board assembly 100 is bent in a portion of the metal fitting 50 after being separated from the frame 1A, as illustrated in FIG. 1E. Here, the circuit board assembly 100 is bent at an angle of 90° as an example.

FIG. 1E is an isometric view illustrating the circuit board assembly 100 and a third circuit board 30 after the bending. The third circuit board 30 corresponds to an example of a support portion referred to in the present embodiment.

A first side 201 of the second circuit board 20 extends adjacent to and parallel to a first side 101 of the first circuit board 10. The first circuit board 10 has a protrusion 14 protruding toward the third circuit board 30 from its second side 102. Similarly to this, the second circuit board 20 also has protrusions 24 and 25 protruding toward the third circuit board 30 from its second side 202.

Through holes 31, 32, and 33 are respectively formed at positions corresponding to the protrusions 14, 24, and 25. After the circuit board assembly 100 is bent, as illustrated in FIG. 1E, the protrusions 14, 24, and 25 are respectively inserted into and soldered to the through holes 31, 32, and 33. The protrusions 14, 24, and 25 and the through holes 31, 32, and 33 take charge of mechanical coupling and electrical connection between the first and second circuit boards 10 and 20 and the third circuit board 30. By the soldering, respective partial circuits formed in the first circuit board 10, the second circuit board 20, and the third circuit board 30 are connected to one another to form one circuit. Each of the protrusions 14, 24, and 25 corresponds to an example of a protrusion referred to in the invention, and each of the through holes 31, 32 and 33 corresponds to an example of an insertion portion referred to in the invention.

The circuit board assembly 100 needs to be finished to a relative position and an opening angle between the first circuit board 10 and the second circuit board 20, which have been strictly adjusted to such an extent that the protrusions 14, 24, and 25 can be respectively smoothly inserted into the through holes 31, 32, and 33. As the relative position between the first circuit board 10 and the second circuit board 20, a highly accurate relative position before the first circuit board 10 and the second circuit board 20 are cut out from the circuit board 1 of a large size is kept as it is. Thus, the circuit board assembly 100 may be bent such that only a bending angle of the metal fitting 50 satisfies a defined accuracy.

A circuit board assembly according to each of the embodiments described below can adopt the manufacturing method illustrated in FIGS. 1A-1E so that time and cost required for manufacture can be reduced. For reference, the accuracy of a general through hole and a required assembly accuracy of two circuit boards are listed.

Figure 2A:
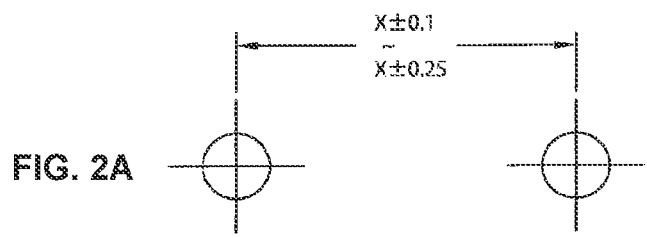
FIGS. 2A-2C schematically illustrate the accuracy of a general through hole on a circuit board.
Figure 2B:
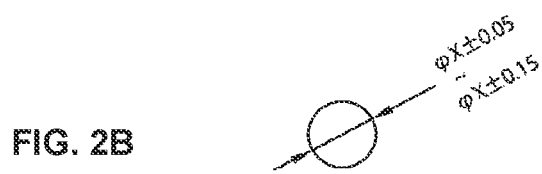
Figure 2C:

FIGS. 2A-2C illustrate the accuracy of a general through hole on a circuit board. FIG. 2A illustrates the accuracy of a positional relationship between respective general through holes on circuit boards. The accuracy has a tolerance of ±0.1 mm to ±0.25 mm for a true relative distance X between two through holes. FIG. 2B illustrates the accuracy of the diameter of a general through hole on a circuit board. The accuracy has a tolerance of ±0.05 mm to ±0.15 mm for a true diameter φx. The assembly accuracy of two circuit boards needs to be set in consideration of the accuracy of the diameter of the through hole. Further, FIG. 2C illustrates a gap in design between a general through hole on a circuit board and a terminal to be inserted into the through hole. Generally, the gap is set to 0.1 mm to 0.5 mm. The larger the gap is, the lower the assembly accuracy of two circuit boards can be made. However, when the gap is too large, a fixing force between the circuit boards with solder may be insufficient or unstable.

Figure 3A:
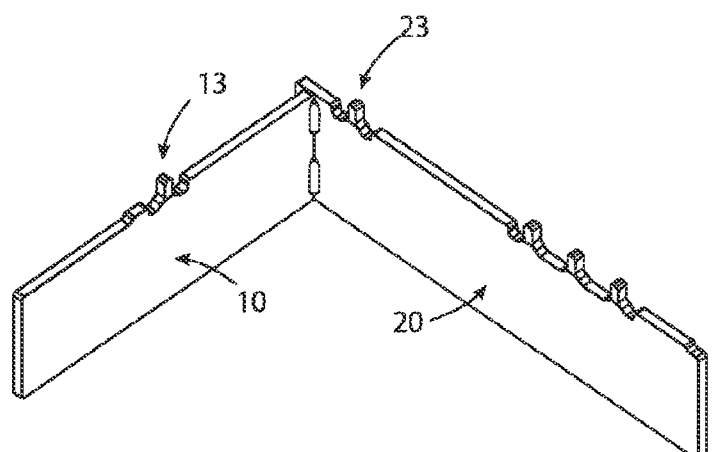
FIGS. 3A and 3B schematically illustrate a required accuracy of a relative position between terminals to be respectively smoothly inserted into through holes.
Figure 3B:
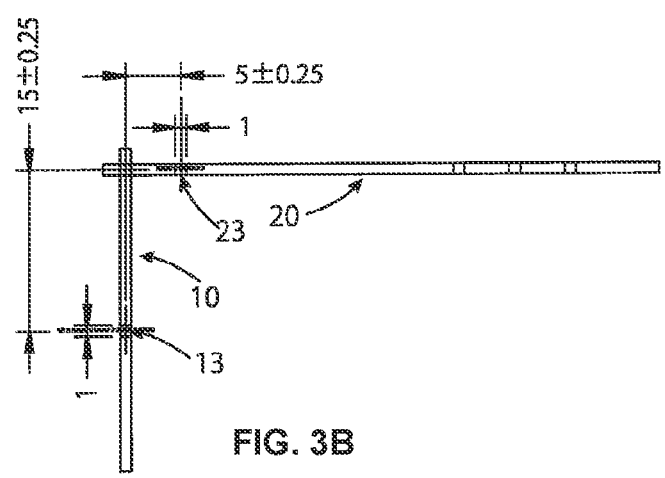

FIGS. 3A and 3B illustrate a required accuracy of a relative position between terminals to be respectively smoothly inserted into through holes. As illustrated in FIG. 3A, it is assumed that the first circuit board 10 and the second circuit board 20 are separately cut out and then assembled. The terminal corresponds to a protrusion 13, 23 of each of the circuit boards 10, 20, and the protrusion 13, 23 is a part of the circuit board 10, 20. Thus, the accuracy of the relative position between the terminals can be considered as the assembly accuracy of the two circuit boards 10, 20.

In FIGS. 3A and 3B, a positional relationship between the protrusion 13 in the first circuit board 10 and the protrusion 23 in the second circuit board 20 is defined in two directions. As illustrated in FIG. 3B, a distance between the center of the width of the protrusion 13 in the first circuit board 10 and the center of the thickness of the protrusion 23 in the second circuit board 20 is 15 mm, and a tolerance of the distance is ±0.25 mm. That is, it is defined that the distance is to be within a range from 14.75 mm to 15.25 mm. In a direction perpendicular to a direction along the first circuit board 10, a distance between the center of the thickness of the protrusion 13 in the first circuit board 10 and the center of the width of the protrusion 23 in the second circuit board 23 is 5 mm, and a tolerance of the distance is ±0.25 mm. That is, it is specified that the distance is to be within a range from 4.75 mm to 5.25 mm.

In the manufacturing method illustrated in FIGS. 1A-1E, the relative position between the first circuit board 10 and the second circuit board 20 is accurately kept. Thus, the assembly accuracy can be substantially ignored. In other words, a bent plate-shaped metal fitting 50 rigid enough to maintain the assembly accuracy after the first circuit board 10 and the second circuit board 20 are cut out from the circuit board 1 of a large size has been adopted.

Various types of embodiments of the circuit board assembly according to the invention will be described below. In the embodiments described below, the circuit board assemblies will be described by adopting reference numerals adopted in the circuit board assembly 100 illustrated in FIG. 1 as they are even if different in form for the sake of clarity. Overlapping description for a content described with reference to FIG. 1 and overlapping description for a content described in an embodiment listed above in embodiments listed below may be omitted.

Figure 4A:
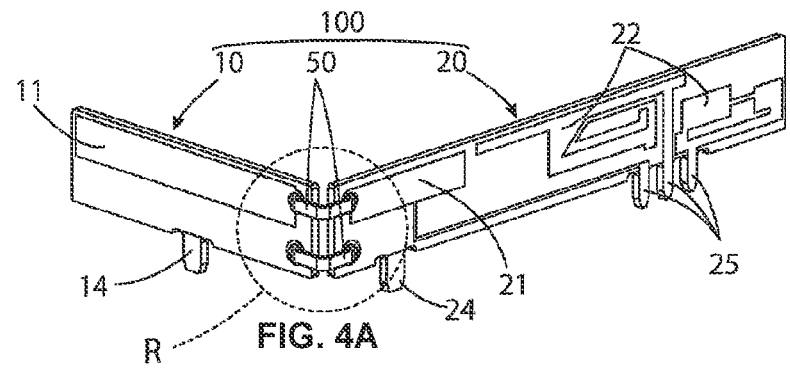
FIGS. 4A-4C illustrate a circuit board assembly according to a first embodiment of the invention.
Figure 4B:
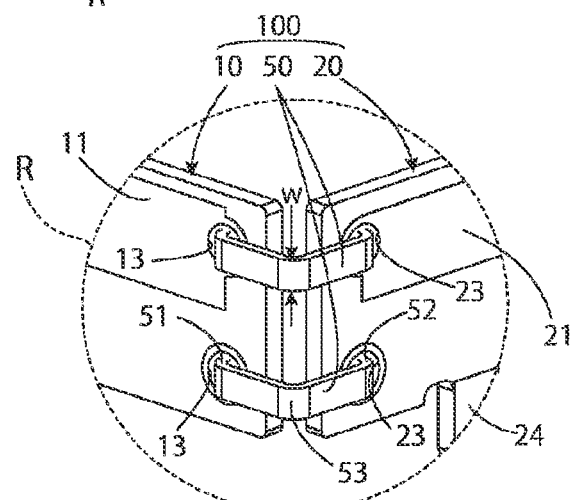
Figure 4C:
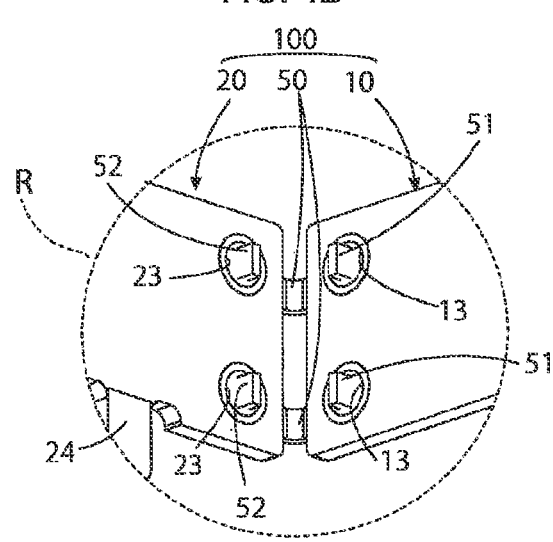

FIGS. 4A-4C illustrate a circuit board assembly 100 according to a first embodiment of the invention. FIGS. 4A, 4B, and 4C are respectively an isometric view of a circuit board assembly 100, an enlarged view of a portion of a circle R indicated by a dotted line in FIG. 4A, and an enlarged view illustrating the rear side of the portion of the circle R.

The circuit board assembly 100 illustrated in FIG. 4A is the same as the circuit board assembly 100 illustrated in FIG. 1, and includes a first circuit board 10, a second circuit board 20, and a metal fitting 50 that connects the circuit boards. A first circuit portion 11 is formed in the first circuit board 10, and a second circuit portion 21 and a third circuit portion 22 are formed in the second circuit board 10. The first circuit portion 11 and the second circuit portion 21 are electrically connected to each other by the metal fitting 50, to constitute one antenna. When the circuit board assembly 100 is adopted for the antenna, for example, an antenna having a stabler performance than that of a combination of the metal fitting and the electrical wiring is implemented.

Through holes 13 and 23 are respectively formed in the first circuit board 10 and the second circuit board 20, and end portions 51 and 52 of the metal fitting 50 are respectively inserted into the through holes 13 and 23. In the metal fitting 50, both the end portions 51 and 52 are respectively inserted into the through holes 13 and 23, and solder is poured into and attached to respective gaps between the through holes 13 and 23 and the end portions 51 and 52 of the metal fitting 50 inserted into the through holes 13 and 23. As a result, the metal fitting 50 mechanically connects the first circuit board 10 and the second circuit board 20 to each other. Out of illustrated two metal fittings 50, the metal fitting 50 illustrated on the upper side also electrically connects the first circuit portion 11 and the second circuit portion 21 to each other. A protrusion 14 is formed in the first circuit board 10, and protrusions 24 and 25 are formed in the second circuit board 20.

The metal fitting 50 is a metal flat plate punched in a strip shape and bent to respectively insert both its end portions into the through holes 13 and 23. In the metal fitting 50, both the end portions 51 and 52 are respectively inserted into and soldered to the through holes 13 and 23, and a central portion 53 is further bent at a predetermined angle (90° herein).

It is assumed that the first circuit board 10 and the second circuit board 20 are connected to each other by a jumper wire instead of the metal fitting 50. The jumper wire is for electrical connection, and a soft material having a relatively low rigidity is used for convenient handling. Accordingly, even if the first circuit board 10 and the second circuit board 20 are connected to each other by the jumper wire and the jumper wire is bent once such that a predetermined angle is formed between the first circuit board 10 and the second circuit board 20, a relative posture between the first circuit board 10 and the second circuit board 20 may change due to an action of gravity in the middle of handling.

An example of the metal fitting 50 to be adopted is a metal fitting 50 made of a material, dimensions, and the like rigid enough to maintain a predetermined tolerance for an angle between the first circuit board 10 and the second circuit board 20 even if a posture in a direction of gravity of the circuit board assembly 100 is changed if bent once.

Therefore, when the metal fitting 50 is adopted, a circuit board assembly 100 assembly working time and cost of which have been reduced is implemented.

Figure 5A:
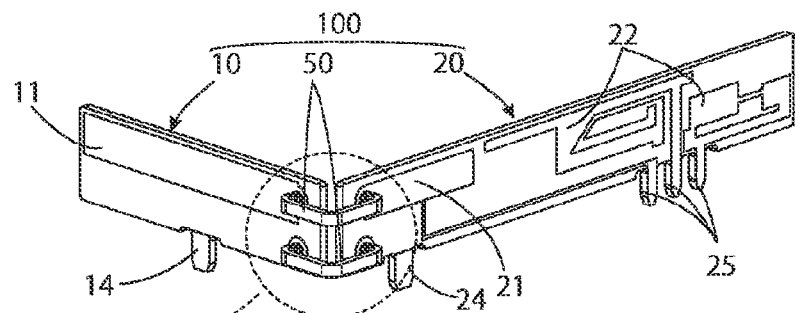
FIGS. 5A-5C illustrate a circuit board assembly according to a second embodiment of the invention.
Figure 5B:
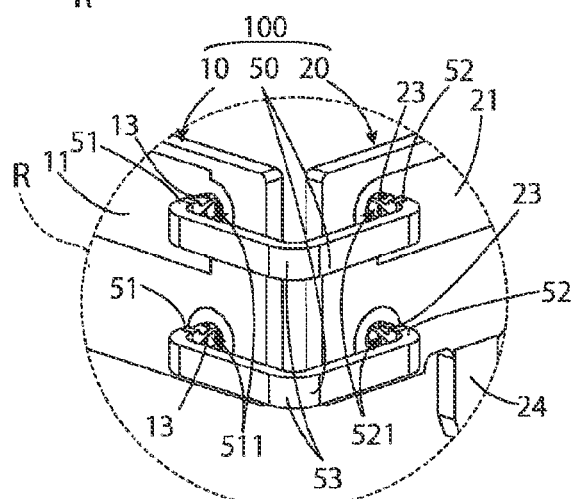
Figure 5C:
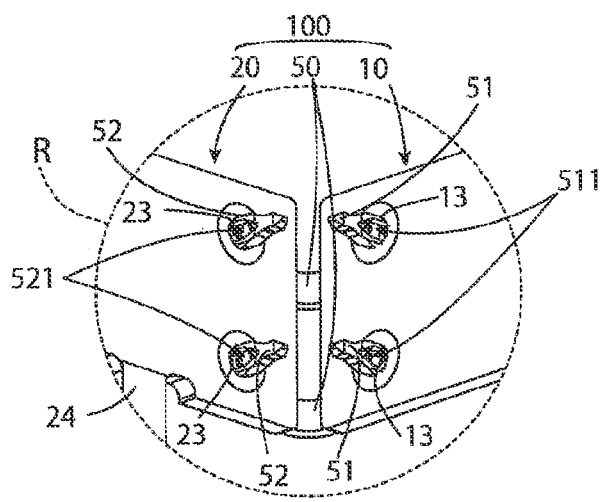

FIGS. 5A-5C illustrates a circuit board assembly 100 according to a second embodiment of the invention. FIGS. 5A, 5B, and 5C are respectively an isometric view of a circuit board assembly 100, an enlarged view of a portion of a circle R indicated by a dotted line in FIG. 5A, and an enlarged view illustrating the rear side of the portion of the circle R.

A difference of the second embodiment illustrated in FIG. 5 from the first embodiment illustrated in FIG. 4 is a shape of both end portions 51 and 52 of a metal fitting 50. Both the end portions 51 and 52 of the metal fitting 50 are respectively provided with holes 511 and 521, and the end portions 51 and 52 are respectively inserted into through holes 13 and 23 to crush the holes 511 and 521. That is, the end portions 51 and 52 are respectively press-fitted into the through holes 13 and 23. Thus, the metal fitting 50 may connect the first circuit board 10 and the second circuit board 20 to each other by the press fitting. The metal fitting 50 is also obtained by punching a metal flat plate in a strip shape and bending both its end portions 51 and 52 and further bending its central portion 53, and corresponds to an example of a bent plate-shaped metal fitting referred to in the invention.

The first circuit board 10 and the second circuit board 20 may be more firmly connected to each other by both press-fitting and soldering, although connected to each other by only press-fitting of both the end portions 51 and 52 of the metal fitting 50 in the second embodiment.

Figure 6A:
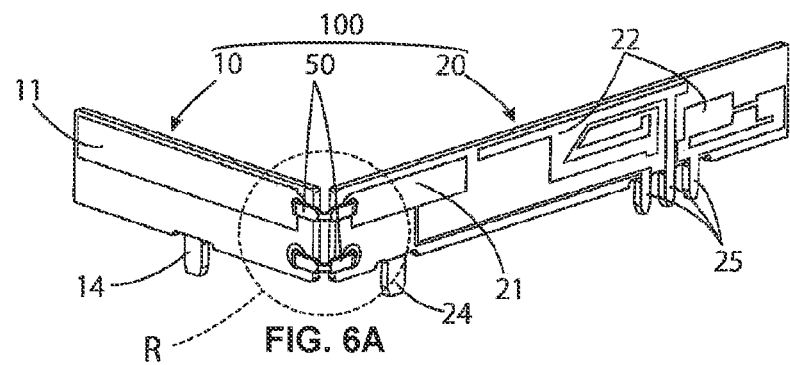
FIGS. 6A-6C illustrate a circuit board assembly according to a third embodiment of the invention.
Figure 6B:
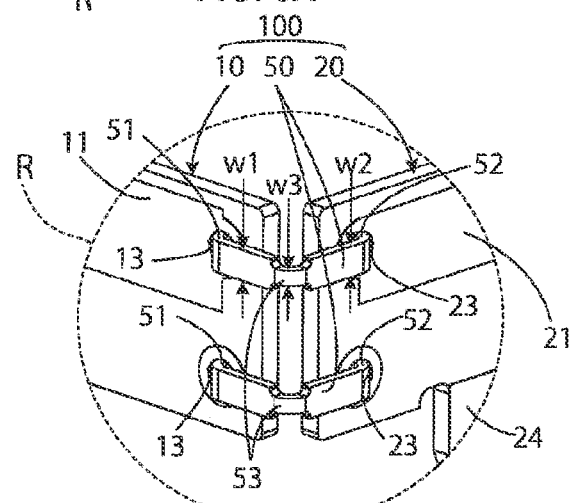
Figure 6C:
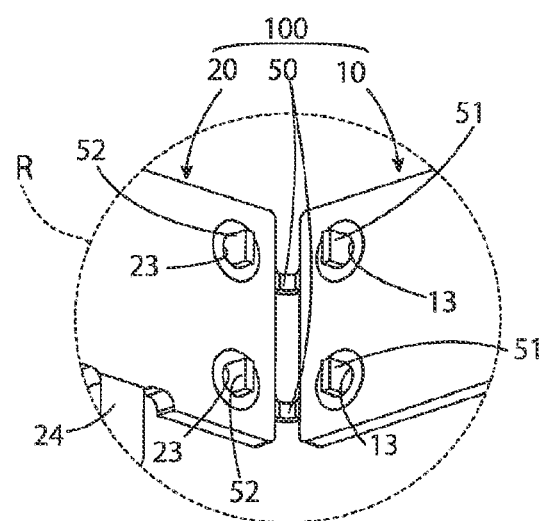

FIGS. 6A-6C illustrate a circuit board assembly 100 according to a third embodiment of the invention. FIGS. 6A, 6B, and 6C are respectively an isometric view of a circuit board assembly 100, an enlarged view of a portion of a circle R indicated by a dotted line in FIG. 6A, and an enlarged view illustrating the rear side of the portion of the circle R.

A difference of the third embodiment illustrated in FIGS. 6A-6C from the first embodiment illustrated in FIGS. 4A-4C is relative dimensions of both end portions 51 and 52 of a metal fitting 50 and through holes 13 and 23 and the width of a central portion 53 of the metal fitting 50.

In the first embodiment illustrated in FIGS. 4A-4C, a width w of the metal fitting 50 is smaller than the diameter of the through holes 13 and 23, and both the end portions 51 and 52 are fixed to each other by soldering after being respectively inserted into the through holes 13 and 23. On the other hand, in the third embodiment illustrated in FIGS. 6A-6C, a width w of the metal fitting 50 is made slightly larger than the diameter of the through holes 13 and 23, and both the end portions 51 and 52 are respectively press-fitted into the through holes 13 and 23, although a cross sectional shape of both the end portions 51 and 52 of the metal fitting 50 remains rectangular, like in the first embodiment. The end portions 51 and 52 may be more firmly fixed to each other using press fitting and soldering in combination.

In the metal fitting 50 in the third embodiment illustrated in FIGS. 6A-6C, a width w2 of the central portion 53 is smaller than a width w1 of both the end portions 51 and 52. This is because a position where the metal fitting 50 is bent is guided to the central portion 53 to make it easy to bend the central portion 53 at a correct angle when an angle is formed between the first circuit board 10 and the second circuit board 20.

The metal fitting 50 illustrated in FIGS. 6A-6C is also obtained by punching a metal flat plate in a strip shape and bending both its end portions 51 and 52 and further bending its central portion 53, and corresponds to an example of a bent plate-shaped metal fitting referred to in the invention.

Both the end portions 51 and 52 of the metal fitting 50 may be respectively inserted into and soldered to the through holes 13 and 23, or may be respectively press-fitted into the through holes 13 and 23, or soldering and press fitting may be used in combination, as illustrated in the examples described above. This point is similar to that in each of embodiments described below, and reference to a method for respectively fixing both end portions 51 and 52 of a metal fitting 50 into through holes 13 and 23 is omitted.

Figure 7A:
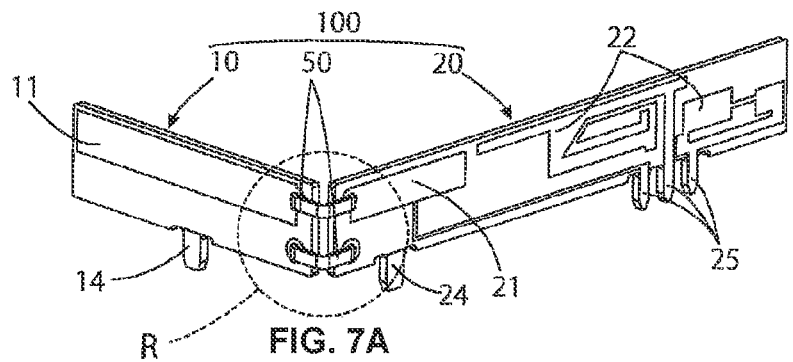
FIGS. 7A-7C illustrate a circuit board assembly according to a fourth embodiment of the invention.
Figure 7B:
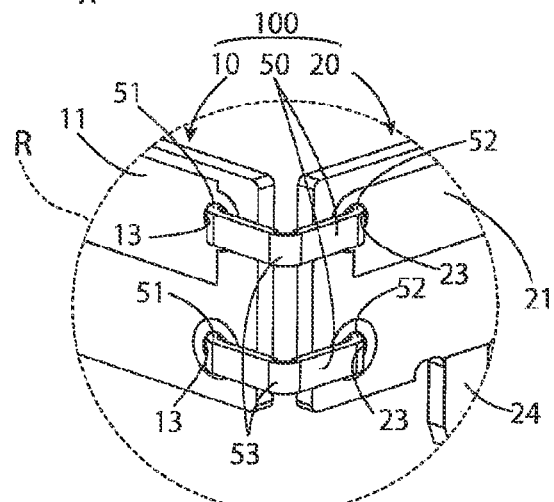
Figure 7C:
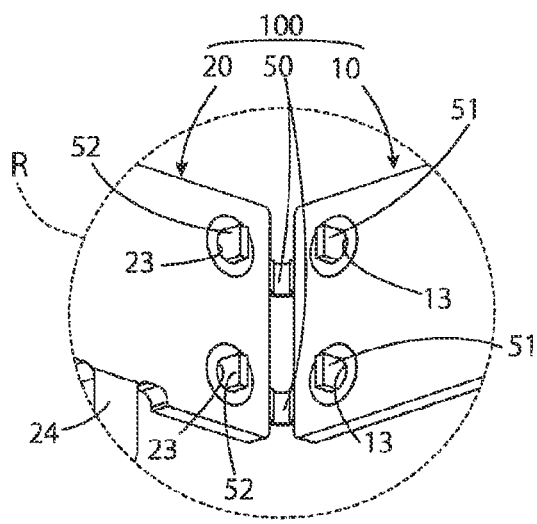

FIGS. 7A-7C illustrate a circuit board assembly 100 according to a fourth embodiment of the invention. FIGS. 7A, 7B, and 7C are respectively an isometric view of a circuit board assembly 100, an enlarged view of a portion of a circle R indicated by a dotted line in FIG. 7A, and an enlarged view illustrating the rear side of the portion of the circle R.

In a metal fitting 50 in the third embodiment illustrated in FIGS. 7A-7C, the wall thickness of a central portion 53 is smaller than that of both end portions 51 and 52. This is also for making it easy to bend the central portion 53, like in the third embodiment illustrated in FIG. 6.

The metal fitting 50 illustrated in FIGS. 7A-7C is also obtained by punching a metal flat plate in a strip shape, crushing its central portion 53 such that the wall thickness thereof decreases at the time of the punching, and bending both its end portions 51 and 52 and further bending the central portion 53, and corresponds to an example of a bent plate-shaped metal fitting referred to in the invention.

Figure 8A:
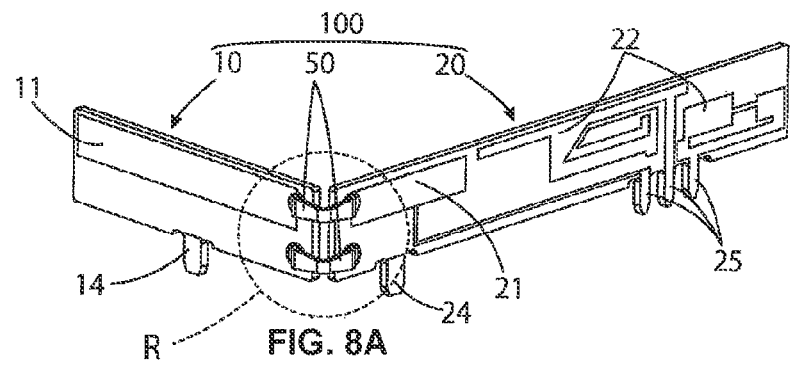
FIGS. 8A-8C illustrate a circuit board assembly according to a fifth embodiment of the invention.
Figure 8B:
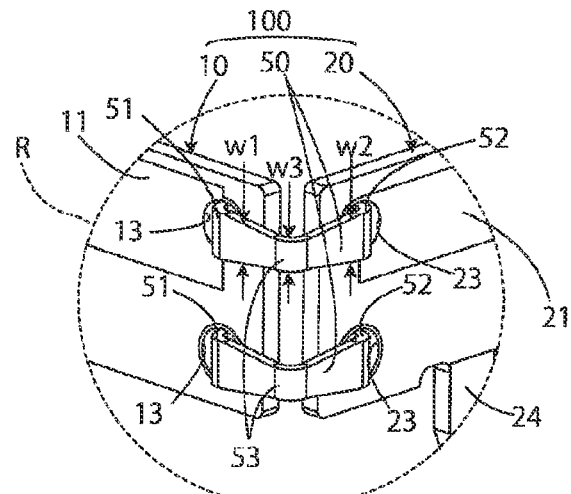
Figure 8C:
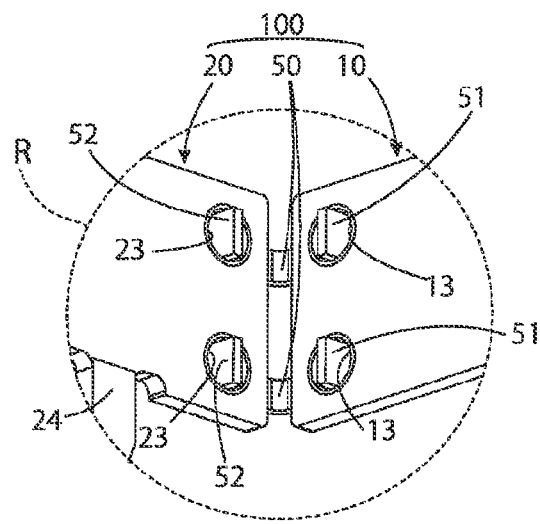

FIGS. 8A-8C illustrate a circuit board assembly according to a fifth embodiment of the invention. FIGS. 8A, 8B, and 8C are respectively an isometric view of a circuit board assembly 100, an enlarged view of a portion of a circle R indicated by a dotted line in FIG. 8A, and an enlarged view illustrating the rear side of the portion of the circle R.

A metal fitting 50 in the fifth embodiment illustrated in FIGS. 8A-8C, a width w2 of a central portion 53 is smaller than a width w1 of both end portions 51 and 52. The metal fitting 50 increases in width toward both the end portions 51 and 52. This is for making it easy to bend the central portion 53.

The metal fitting 50 illustrated in FIGS. 8A-8C is also obtained by punching a metal flat plate in a strip shape and bending both its end portions 51 and 52 and further bending its central portion 53, and corresponds to an example of a bent plate-shaped metal fitting referred to in the invention.

Figure 9A:
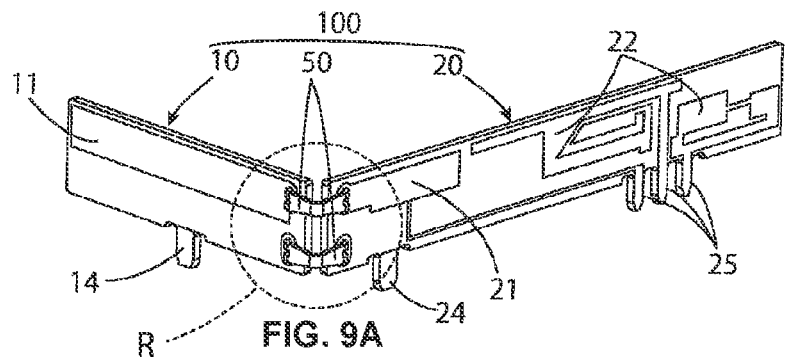
FIGS. 9A-9C illustrate a circuit board assembly according to a sixth embodiment of the invention.
Figure 9B:
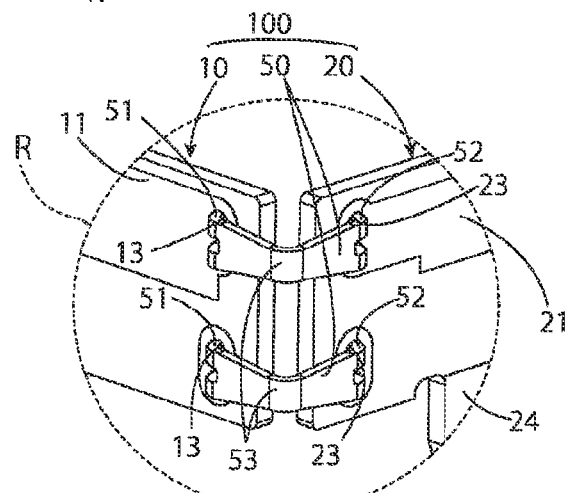
Figure 9C:
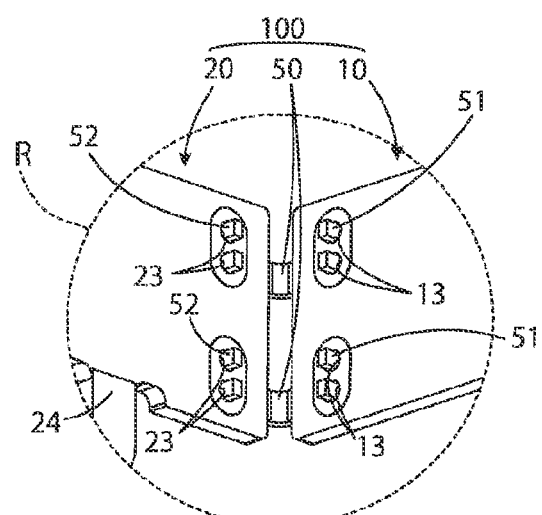

FIGS. 9A-9C is a diagram illustrating a circuit board assembly 100 according to a sixth embodiment of the invention. FIGS. 9A, 9B, and 9C are respectively an isometric view of a circuit board assembly 100, an enlarged view of a portion of a circle R indicated by a dotted line in FIG. 9A, and an enlarged view illustrating the rear side of the portion of the circle R.

In a metal fitting 50 in the sixth embodiment illustrated in FIGS. 9A-9C, each of both end portions 51 and 52 is two-pronged. Correspondingly, two through holes 13 in a first circuit board 10 and two through holes 23 in a second circuit board 20 are also formed for each metal fitting 50. Both the two-pronged end portions 51 and the two-pronged end portions 52 are respectively inserted into the two through holes 13 and the two through holes 23. When both the end portions 51 and 52 are thus each two-pronged, the number of contact points between the first circuit board 10 and the second circuit board 20 and the metal fitting 50 increases so that the first circuit board 10 and the second circuit board 20 are mechanically firmly fixed to each other and more reliably electrically connected to each other.

The metal fitting 50 illustrated in FIGS. 9A-9C is also obtained by punching a metal flat plate and bending both its end portions 51 and 52 and further bending its central portion 53, and corresponds to an example of a bent plate-shaped metal fitting referred to in the invention.

Figure 10A:
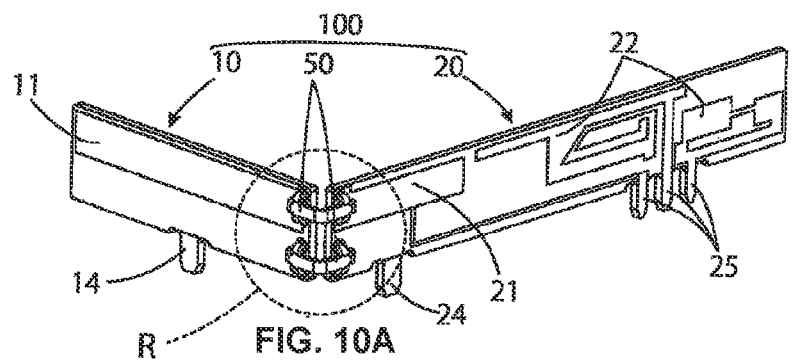
FIGS. 10A-10C illustrate a circuit board assembly according to a seventh embodiment of the invention.
Figure 10B:
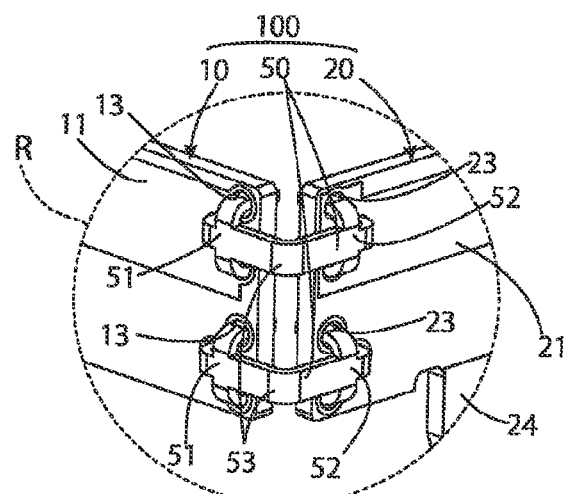
Figure 10C:
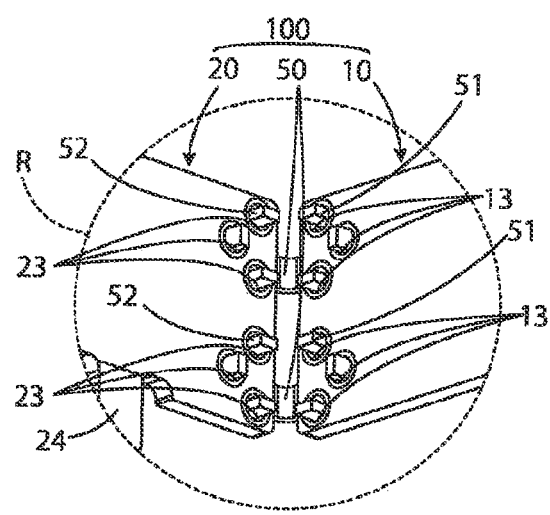

FIGS. 10A-10C illustrate a circuit board assembly according to a seventh embodiment of the invention. FIGS. 10A, 10B, and 10C are respectively an isometric view of a circuit board assembly 100, an enlarged view of a portion of a circle R indicated by a dotted line in FIG. 10A, and an enlarged view illustrating the rear side of the portion of the circle R.

In a metal fitting 50 in the seventh embodiment illustrated in FIGS. 10A-10C, each of both end portions 51 and 52 is three-pronged. Correspondingly, three through holes 13 in a first circuit board 10 and three through holes 23 in a second circuit board 20 are also formed for each metal fitting 50. Both the three-pronged end portions 51 and the three-pronged end portions 52 are respectively inserted into the three through holes 13 and the three through holes 23. The reason why each of both the end portions 51 and 52 is three-pronged is the same as the reason why each of both the end portions 51 is two-pronged. That is, when both the end portions 51 and 52 are each three-pronged, the number of contact points between the first circuit board 10 and the second circuit board 20 and the metal fitting 50 increases so that the first circuit board 10 and the second circuit board 20 are mechanically firmly fixed to each other and more reliably electrically connected to each other.

The metal fitting 50 illustrated in FIGS. 10A-10C is also obtained by punching a metal flat plate and bending both its end portions 51 and 52 and further bending its central portion 53, and corresponds to an example of a bent plate-shaped metal fitting referred to in the invention.

Figure 11A:
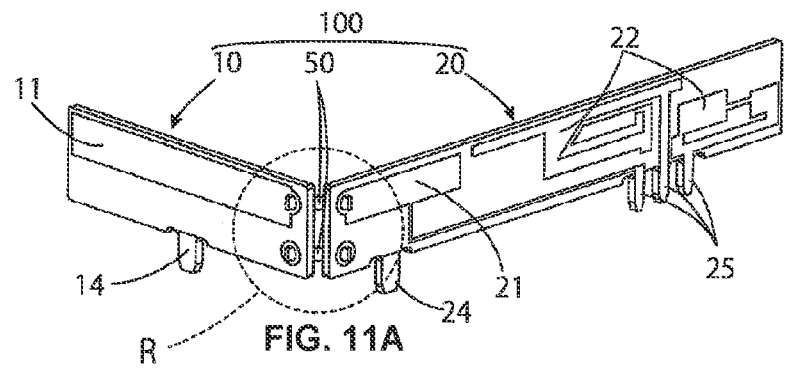
FIGS. 11A-11C illustrate a circuit board assembly according to an eighth embodiment of the invention.
Figure 11B:
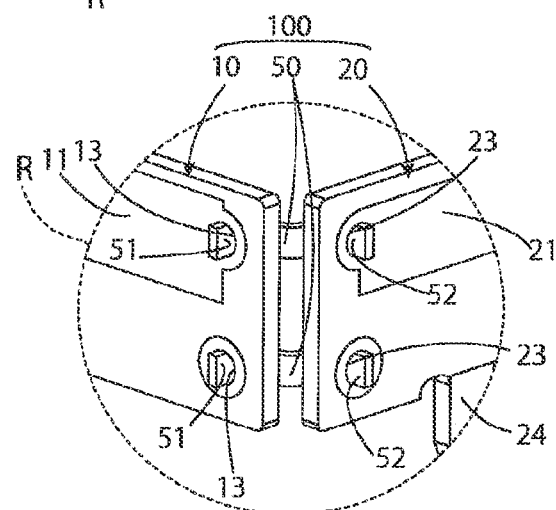
Figure 11C:
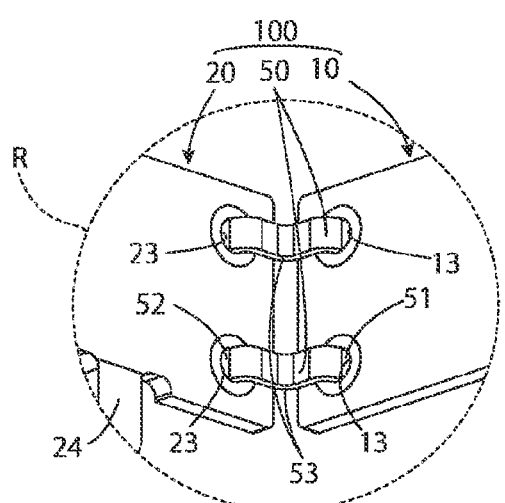

FIGS. 11A-11C is a diagram illustrating a circuit board assembly 100 according to an eighth embodiment of the invention. FIGS. 11A, 11B, and 11C are respectively an isometric view of a circuit board assembly 100, an enlarged view of a portion of a circle R indicated by a dotted line in FIG. 11A, and an enlarged view illustrating the rear side of the portion of the circle R.

In the first to seventh embodiments illustrated in FIGS. 4A to 10C, the metal fitting 50 couples the first circuit board 10 and the second circuit board 20 to each other via the side at an obtuse angle (the side opened at an angle of 270°). On the other hand, the circuit board assembly 100 in the eighth embodiment illustrated in FIGS. 11A-11C couples a first circuit board 10 and a second circuit board 20 to each other via the side at an acute angle (the side opened at an angle of 90°).

A metal fitting 50 illustrated in FIGS. 11A-11C is also obtained by punching a metal flat plate and bending both its end portions 51 and 52 and further bending its central portion 53, and corresponds to an example of a bent plate-shaped metal fitting referred to in the invention.

Figure 12A:
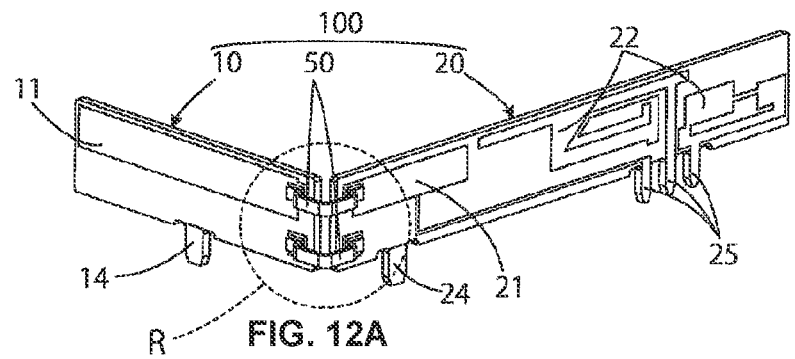
FIGS. 12A-12C illustrate a circuit board assembly according to a ninth embodiment of the invention.
Figure 12B:
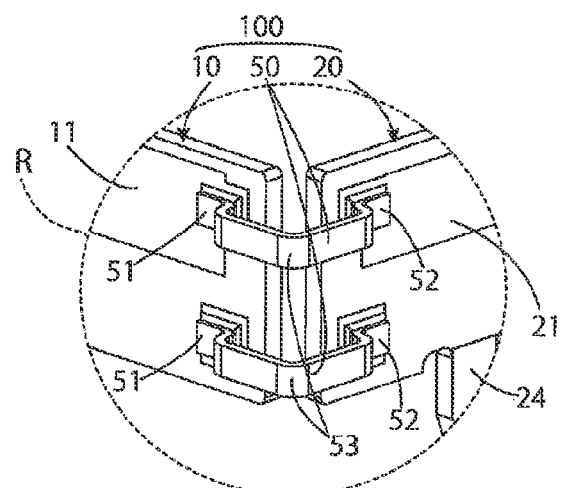
Figure 12C:
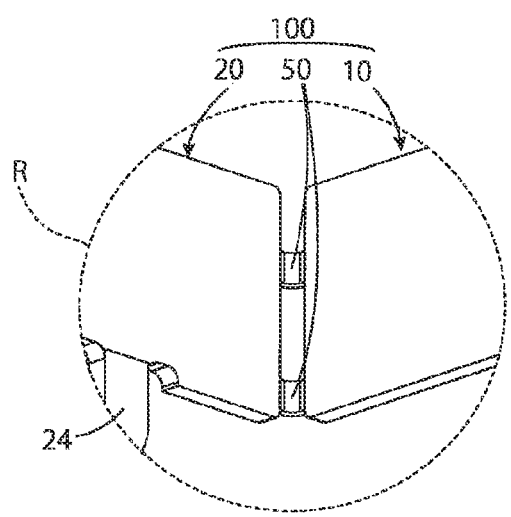

FIGS. 12A-12C illustrate a circuit board assembly 100 according to a ninth embodiment of the invention. FIGS. 12A, 12B, and 12C are respectively an isometric view of a circuit board assembly 100, an enlarged view of a portion of a circle R indicated by a dotted line in FIG. 12A, and an enlarged view illustrating the rear side of the portion of the circle R.

In the first to ninth embodiments illustrated in FIGS. 4A to 11C, the through holes 13 and 23 are respectively formed in the first circuit board 10 and the second circuit board 20, and the metal fitting 50 couples the first circuit board 10 and the second circuit board 20 to each other with both the end portions 51 and 52 respectively inserted into the through holes 13 and 23. On the other hand, the circuit board assembly 100 according to the ninth embodiment illustrated in FIGS. 12A-12C are bent in a direction in which both end portions 51 and 52 of a metal fitting 50 are respectively bent in a direction along respective surfaces of a first circuit board 10 and a second circuit board 20, and are respectively soldered to the surfaces of the first circuit board 10 and the second circuit board 20. Thus, the metal fitting 50 may be soldered to the respective surfaces of the first circuit board 10 and the second circuit board 20.

The metal fitting 50 illustrated in FIGS. 12A-12C is also obtained by punching a metal flat plate and bending both its end portions 51 and 52 and further bending its central portion 53, and corresponds to an example of a bent plate-shaped metal fitting referred to in the invention.

Figure 13A:
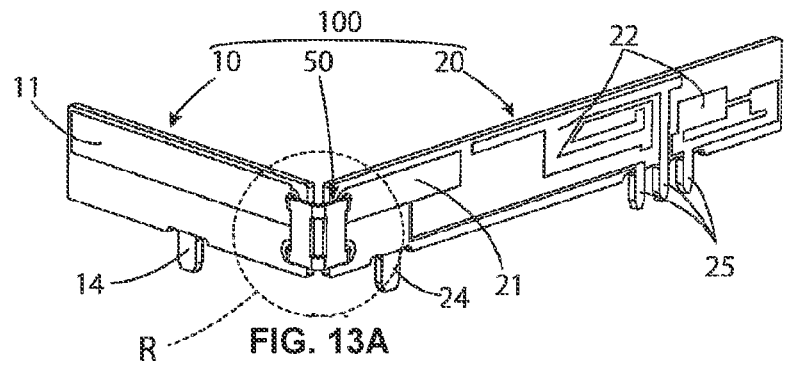
FIGS. 13A-13C illustrate a circuit board assembly according to a tenth embodiment of the invention.
Figure 13B:
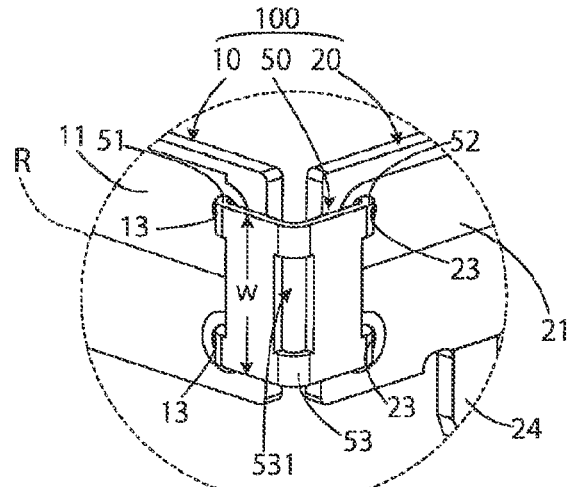
Figure 13C:
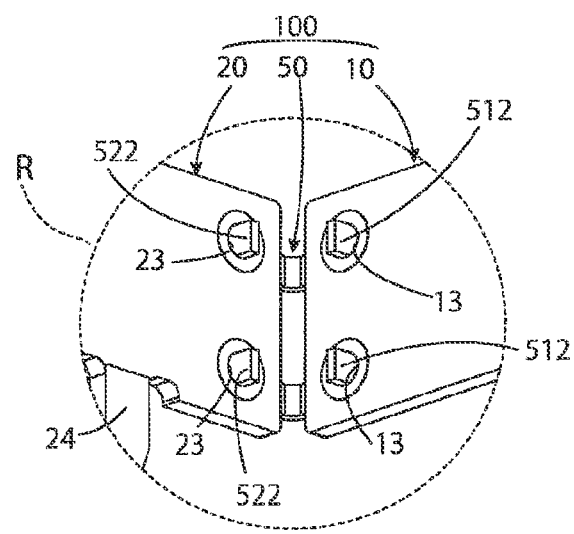

FIGS. 13A-13C illustrate a circuit board assembly 100 according to a tenth embodiment of the invention. FIGS. 13A, 13B, and 13C are respectively an isometric view of a circuit board assembly 100, an enlarged view of a portion of a circle R indicated by a dotted line in FIG. 13A, and an enlarged view illustrating the rear side of the portion of the circle R.

In the first to ninth embodiments illustrated in FIGS. 4A to 12C, the first circuit board 10 and the second circuit board 20 are coupled to each other by the two metal fittings 50. On the other hand, in the tenth embodiment illustrated in FIGS. 13A-13C, a first circuit board 10 and a second circuit board 20 are connected to each other by one metal fitting 50 having a large width w. Although the number of metal fittings 50 is one, two through holes 13 and two through holes 23 are respectively formed in the first circuit board 10 and the second circuit board 20. Accordingly, two leg portions 512 and two leg portions 522 are respectively formed in both end portions 51 and 52 of the metal fitting 50, and the one leg portion 512 and the one leg portion 522 are respectively inserted into each of the through holes 13 and each of the through holes 23. A hole 531 is formed in a central portion 53 of the metal fitting 50 such that the central portion 53 can be bent with an appropriate force.

Thus, the number of metal fittings 50 that each couple the first circuit board 10 and the second circuit board 20 to each other need not be two, may be one, as illustrated in FIGS. 13A-13C, or may be three or more, although illustration thereof is omitted.

The metal fitting 50 illustrated in FIGS. 13A-13C is also obtained by punching a metal flat plate and bending both its end portions 51 and 52 and further bending its central portion 53, and corresponds to an example of a bent plate-shaped metal fitting referred to in the invention.

Figure 14A:
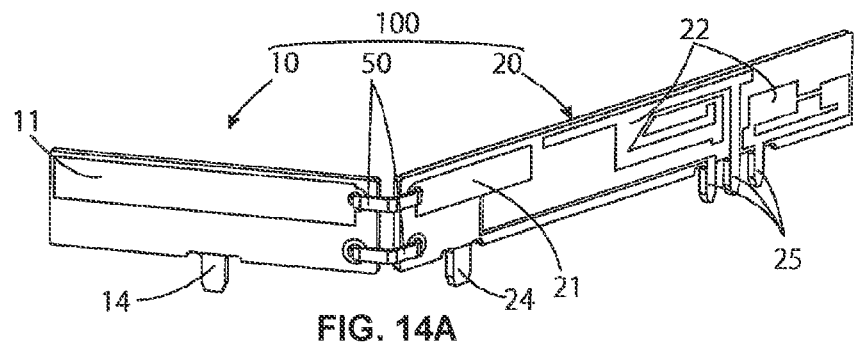
FIGS. 14A-14C illustrate a circuit board assembly according to an eleventh embodiment of the invention.
Figure 14B:
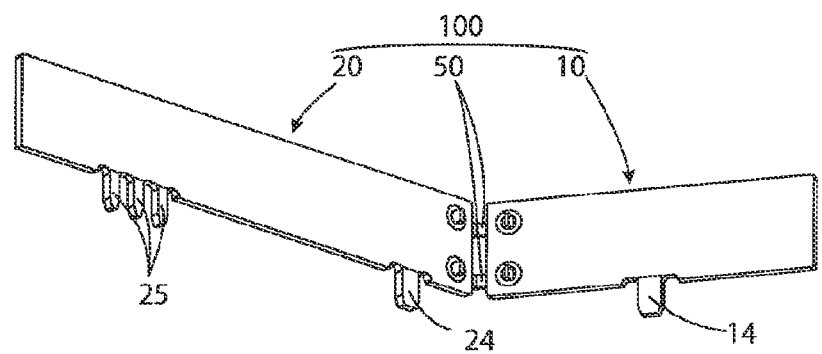
Figure 14C:
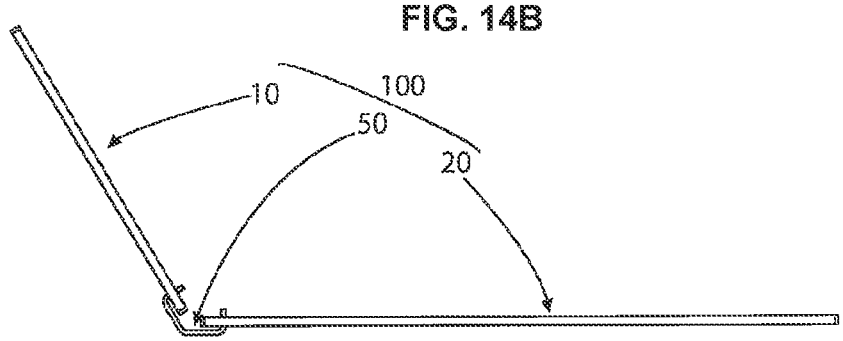

FIGS. 14A-14C illustrate a circuit board assembly 100 according to an eleventh embodiment of the invention. FIGS. 14A, 14B, and 14C are respectively an isometric view of a circuit board assembly 100 as viewed from the front surface side thereof and an isometric view and a side view of the circuit board assembly 100 as viewed from the rear surface side thereof.

In the first to tenth embodiments illustrated in FIGS. 4A to 13C, the metal fitting 50 couples the first circuit board 10 and the second circuit board 20 to each other to maintain a posture in which the first circuit board 10 and the second circuit board 20 are opened at an angle of 90°. On the other hand, the circuit board assembly 100 according to the eleventh embodiment illustrated in FIGS. 14A-14C couples a first circuit board 10 and a second circuit board 20 to each other to maintain a posture in which the first circuit board 10 and the second circuit board 20 are opened at an angle of not 90° but 120°, for example. An angle formed between the first circuit board 10 and the second circuit board 20 need not be 90° but may be any angle excluding 180°, as illustrated in FIGS. 14A-14C.

A metal fitting 50 illustrated in FIGS. 14A-14C is also obtained by punching a metal flat plate and bending both its end portions 51 and 52 and further bending its central portion 53, and corresponds to an example of a bent plate-shaped metal fitting referred to in the invention.

Figure 15A:
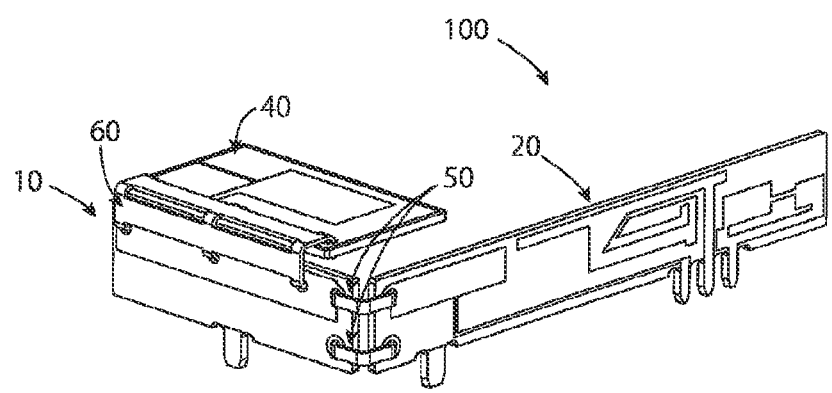
FIGS. 15A and 15B illustrate a circuit board assembly according to a twelfth embodiment of the invention.
Figure 15B:
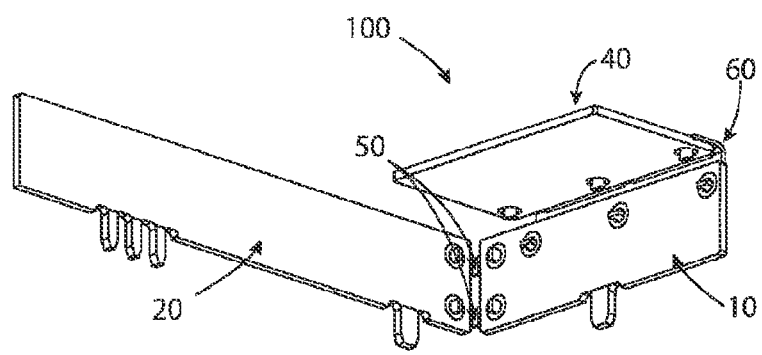

FIGS. 15A and 15B illustrate a circuit board assembly 100 according to a twelfth embodiment of the invention. FIGS. 15A and 15B are respectively isometric views of a circuit board assembly 100 as viewed from the front surface side and the rear surface side thereof.

In the first to eleventh embodiments illustrated in FIGS. 4A to 14C, the circuit board assembly 100 has a structure in which the two circuit boards, i.e., the first circuit board 10 and the second circuit board 20 are connected to each other by the metal fitting 50. However, the circuit board assembly 100 illustrated in FIGS. 15A and 15B further includes a fourth circuit board 40 and a metal fitting 60. The fourth circuit board 40 is connected to a first circuit board 10 by the metal fitting 60. Thus, the circuit board assembly 100 may have a structure obtained by connecting three or more circuit boards to one another.

The metal fitting 60 shown in FIGS. 15A and 15B is also obtained by punching a metal flat plate and bending both its end portions and further bending its central portion, and corresponds to an example of a bent plate-shaped metal fitting referred to in the invention.

As described above, according to the invention, an angle between circuit boards and a positional relationship between the circuit boards are strictly adjusted, and a circuit board assembly that has attained low cost is implemented, as illustrated in the first to twelfth embodiments.

What is claimed is:

1. A circuit board assembly, comprising:
a first circuit board;
a second circuit board having a first side extending adjacent to a first side of the first circuit board and being in a posture having an angle other than 180° to the first circuit board, the first circuit board and the second circuit board each have a protrusion protruding from a second side, the second side of the first circuit board and the second side of the second circuit board are mounted on a support portion; and
a metal fitting including a portion bent at the angle and spanning both the first side of the first circuit board and the first side of the second circuit board, the metal fitting is fixed to both the first circuit board and the second circuit board.

2. The circuit board assembly of claim 1, wherein the metal fitting has a rigidity with which a bent posture is maintained regardless of a position of the first circuit board and the second circuit board with respect to gravity.

3. The circuit board assembly of claim 1, wherein the metal fitting is bent from a plate-shape.

4. The circuit board assembly of claim 1, wherein the protrusion of the first circuit board and the protrusion of the second circuit board are inserted into a plurality of insertion portions in the support portion.

5. The circuit board assembly of claim 4, wherein the metal fitting has a rigidity sufficient to maintain an angle at which the protrusion of the first circuit board and the protrusion of the second circuit board can be inserted into the insertion portions prior to insertion.

6. The circuit board assembly of claim 1, wherein the first circuit board, the second circuit board, and the support portion form a circuit.

7. The circuit board assembly of claim 1, wherein the first circuit board has a first circuit portion and the second circuit board has a second circuit portion electrically connected with the first circuit portion.

8. The circuit board assembly of claim 7, wherein the metal fitting mechanically fixes the first circuit board and the second circuit board.

9. The circuit board assembly of claim 8, wherein the metal fitting electrically connects the first circuit portion and the second circuit portion.

10. The circuit board assembly of claim 7, wherein the first circuit portion and the second circuit portion are each part of an antenna.

11. The circuit board assembly of claim 1, wherein the first circuit board and the second circuit board each have a receiving portion receiving the metal fitting.

12. The circuit board assembly of claim 11, wherein the metal fitting is press-fit into the receiving portion of the first circuit board and the second circuit board.

13. The circuit board assembly of claim 1, wherein the metal fitting is soldered to both the first circuit board and the second circuit board.

14. A circuit board assembly, comprising:
a first circuit board;
a second circuit board having a first side extending adjacent to a first side of the first circuit board and being in a posture having an angle other than 180° to the first circuit board, the first circuit board and the second circuit board each have a second side mounted on a support portion; and
a metal fitting including a portion bent at the angle and spanning both the first side of the first circuit board and the first side of the second circuit board, the metal fitting is fixed to both the first circuit board and the second circuit board, the metal fitting is monolithically formed in a single piece.

15. A circuit board assembly, comprising:
a first circuit board;
a second circuit board having a first side extending adjacent to a first side of the first circuit board and being in a posture having an angle other than 180° to the first circuit board, the first circuit board and the second circuit board each have a second side mounted on a support portion; and
a plurality of metal fittings each including a portion bent at the angle and each spanning both the first side of the first circuit board and the first side of the second circuit board, the metal fittings are separate and spaced apart from one another to fix both the first circuit board and the second circuit board.

* * * * *